United States Patent
Pang et al.

(10) Patent No.: US 9,331,135 B2
(45) Date of Patent: May 3, 2016

(54) ORGANIC LIGHT EMITTING DISPLAY

(71) Applicant: LG Display Co., Ltd., Seoul (KR)

(72) Inventors: HeeSuk Pang, Gyeonggi-do (KR); Jaehyuk Lee, Gyeonggi-do (KR); JooHwan Shin, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/542,826

(22) Filed: Nov. 17, 2014

(65) Prior Publication Data

US 2015/0144911 A1  May 28, 2015

(30) Foreign Application Priority Data

Nov. 26, 2013 (KR) .................. 10-2013-0144748

(51) Int. Cl.
*H05B 33/08* (2006.01)
*H01L 27/32* (2006.01)
*H01L 51/52* (2006.01)

(52) U.S. Cl.
CPC ........ *H01L 27/3276* (2013.01); *H01L 51/5246* (2013.01); *H01L 51/5284* (2013.01)

(58) Field of Classification Search
USPC ........................................... 313/504
See application file for complete search history.

(56) References Cited

U.S. PATENT DOCUMENTS

| | | | | |
|---|---|---|---|---|
| 2005/0184927 A1* | 8/2005 | Kwak | | 345/45 |
| 2006/0250083 A1* | 11/2006 | Oh et al. | | 313/512 |
| 2007/0195252 A1* | 8/2007 | Tsai et al. | | 349/143 |
| 2010/0019665 A1* | 1/2010 | Kwon et al. | | 313/504 |

* cited by examiner

*Primary Examiner* — Nimeshkumar Patel
*Assistant Examiner* — Brenitra M Lee
(74) *Attorney, Agent, or Firm* — Morgan, Lewis & Bockius LLP

(57) ABSTRACT

The present disclosure provides an organic light emitting display including: a first substrate including a display area where an organic light emitting device is formed and a non-display area where a plurality of pads are formed, a second substrate facing and spaced apart from the first substrate, a pattern formed in the non-display area of the first substrate and having openings, and an adhesive layer formed between the first substrate and the second substrate and covering a portion of the pattern.

16 Claims, 12 Drawing Sheets

ORGANIC LIGHT EMITTING DISPLAY

CROSS-REFERENCE TO RELATED APPLICATION

This application claims priority from and the benefit under 35 U.S.C. §119(a) of Korean Patent Application No. 10-2013-0144748, filed on Nov. 26, 2013, which is hereby incorporated by reference for all purposes as if fully set forth herein.

BACKGROUND OF THE INVENTION

1. Field of the Invention

The present invention relates to an organic light emitting display.

2. Description of the Related Art

An image display for displaying various types of information on a screen corresponds to a core technology in the age of information communication and is developing in the direction toward a thinner, lighter, portable, and higher-performance display.

An organic light emitting display is a self-emitting device using a thin light-emitting layer between electrodes and is advantageous in that it can be made to be as thin as paper.

A typical organic light emitting display is susceptible to both degradations by internal factors, such as degradation of an electrode and a light-emitting layer by oxygen and degradation by reaction between a light-emitting layer and an interface, and degradations by external factors, such as external moisture, oxygen, ultraviolet rays, and manufacturing conditions. Especially, since the external oxygen and moisture have a fatal influence on the lifespan of the device, packaging of the organic light emitting display is very important.

SUMMARY OF THE INVENTION

Accordingly, the present invention is directed to an organic light emitting display that substantially obviates on or more of the problems due to limitations and disadvantages of the related art.

An object of the present invention is to provide an organic light emitting display, which allows easy detection of an adhesive failure of an insulation substrate without degrading the visibility.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting display includes a first substrate including a display area where an organic light emitting device is formed and a non-display area where a plurality of pads are formed; a second substrate facing and spaced apart from the first substrate; a pattern formed in the non-display area of the first substrate and having openings; and an adhesive layer formed between the first substrate and the second substrate, the adhesive layer covering a portion of the pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
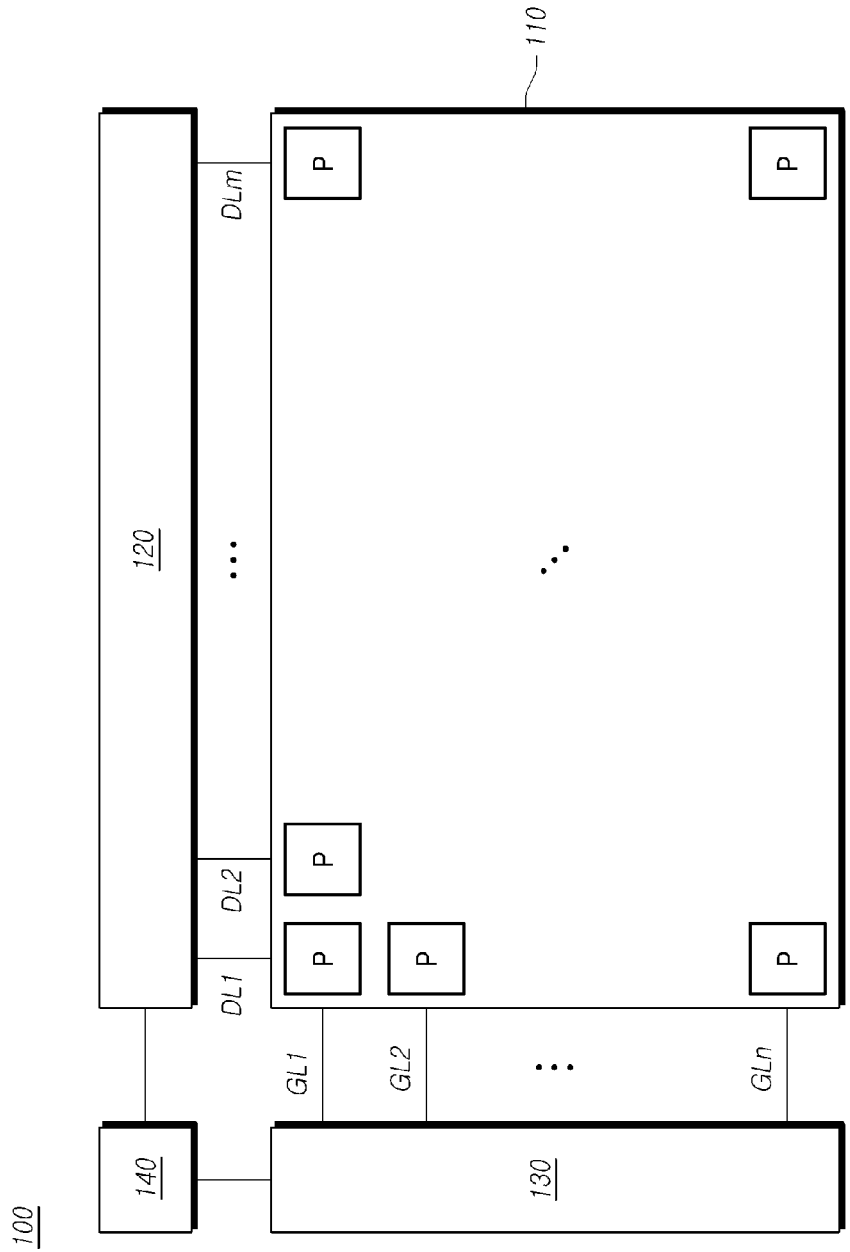
FIG. 1 illustrates a system configuration of an organic light emitting display to which exemplary embodiments are applied.

Hereinafter, exemplary embodiments of the present invention will be described with reference to the exemplary drawings. In the following description, the same elements will be designated by the same reference numerals although they are shown in different drawings. Further, in the following description of embodiments of the present invention, a detailed description of known functions and configurations incorporated herein will be omitted when it may make the subject matter of the present invention rather unclear.

In the description of the elements of the present invention, terms "first", "second", "A", "B", "(a)", "(b)" and the like may be used. Each of these terminologies is not used to define an essence, order or sequence of a corresponding component but used merely to distinguish the corresponding component from other component(s). In the case that it is described that a certain structural element "is connected to", "is coupled with", or "is in contact with" another structural element, it should be interpreted that another structural element may "be connected to", "be coupled with", or "be in contact with" other structural elements as well as that the certain structural element is directly connected to or is in direct contact with another structural element. Likewise, when it is described that a certain element is formed "on" or "under" another element, it should be understood that the certain element may be formed either directly or indirectly via a still another element on or under the another element.

FIG. 1 illustrates a system configuration of an organic light emitting display to which exemplary embodiments are applied.

Referring to FIG. 1, an organic light emitting display 100 for application of embodiments of the present invention includes a display panel 110 in which a plurality of pixels P are defined by data lines DL1 to DLm and gate lines GL1 to GLn crossing each other, a data driver 120 for supplying a data signal to the data lines DL1 to DLm in response to a control signal from a timing controller 140, a gate driver 130 for supplying a scan signal to the gate lines GL1 to GLn in response to a control signal from the timing controller 140, and the timing controller 140 for controlling driving of the data driver 120 and the gate driver 130.

For example, the gate driver 130 may be attached to either one side or both sides of the display panel 110 according to a Tape Automated Bonding (TAB) method, or may be directly formed on one side of the display panel 110 according to a Gate Drive IC in Panel (GIP) method.

In the display panel 110, each of the pixels P defined by the data lines DL1 to DLm and the gate lines GL1 to GLn crossing each other includes an Organic Light-Emitting Diode (OLED) and a Driving Transistor (DT) for controlling a luminance of a screen by causing an electric current to flow through the OLED.

The display panel 110 as described above includes a display area in which pixels P are formed to emit light and a non-display area in which pixels are not formed and pads or wires may be usually formed.

An organic light emitting display 100 according to the embodiment described above may include a first substrate including a display area having organic light emitting devices formed therein and a non-display area having a plurality of pads formed therein; a second substrate spaced apart from and opposed to the first substrate; an adhesive layer formed between the first substrate and the second substrate; and a pattern formed in the non-display area of the first substrate and having openings formed through the pattern.

In the display panel 110 including organic light emitting devices, the display area including pixels formed therein is encapsulated by the second substrate, which corresponds to an encapsulation substrate formed of a plastic thin film, a metal sheet, etc. in consideration of a possibility that the organic light emitting devices may be damaged by moisture or oxygen.

Hereinafter, an organic light emitting display according to an example embodiment of the present invention will be described with reference to the accompanying drawings.

Figure 2:
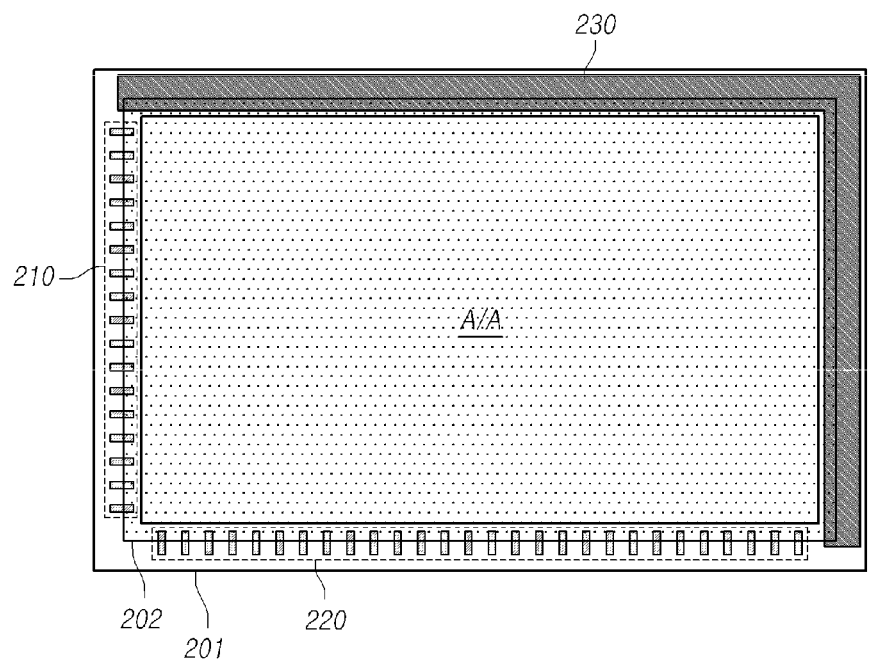
FIG. 2 is a plan view of an organic light emitting display according to a first example embodiment of the present invention.

FIG. 2 is a plan view of an organic light emitting display according to a first example embodiment of the present invention.

Referring to FIG. 2, the first substrate 201 includes a display area (A/A) in which organic light emitting devices are formed and a non-display area in which a plurality of pads are formed. The non-display area is the area other than the display area (A/A). Further, the first substrate 201 is a transparent substrate formed of plastic or glass.

At one edge of the non-display area, gate pads 210 connected to a plurality of gate lines are formed. Further, at another edge of the non-display area, data pads 220 connected to a plurality of data lines are formed.

The gate lines and the data lines are formed to perpendicularly cross each other. Therefore, when a plurality of gate pads 210 are formed in a part of the non-display area at the left side of the display area A/A, the data pads 220 may be formed in a part of the non-display area at a lower side or an upper side of the display area A/A. For reference, the gate pads 210 may be formed in the non-display area at either one or both of the left side and the right side of the display area A/A. Further, the data pads 220 may be formed in the non-display area at either one or both of the upper side and the lower side of the display area A/A.

Further, in the upper and right edges of the non-display area in which the gate pads 210 and the data pads 220 are not formed, a pattern 230 shaped like a character "⌐" is formed. The pattern 230 may be formed of an opaque material through which light cannot pass. The opaque material may be, for example, metal, and the pattern 230 may be formed of a gate metal material or a source/drain metal material. Here, the pattern 230 may be a dummy pattern formed in order to prevent reflection of an external light and can improve the visibility of the organic light emitting display. Further, the pattern 230 formed of metal can be used as a part of a power supply line to supply electric power to the organic light emitting devices.

A second substrate 202 is disposed above and is spaced apart from the first substrate 201.

The second substrate 202 is an encapsulation substrate to encapsulate the display area of the first substrate 201 to thereby prevent oxygen or moisture from permeating into the organic light emitting devices in the display area from the outside. In this event, the second substrate 202 may be formed as a light and thin metal sheet.

Therefore, in order to protect the organic light emitting devices, the second substrate 202 is formed to be slightly larger than the display area A/A to cover the entire display area A/A while partially covering the gate pads 210, the data pads 220, and the pattern 230.

An adhesive layer is formed between the first substrate 201 and the second substrate 202. The first substrate 201 and the second substrate 202 are attached to each other by the adhesive layer. The adhesive layer may be formed of an optical hardening, thermal hardening, or natural hardening material, and may include, for example, a resin-based material.

Like the second substrate 202, the adhesive layer may be formed to be slightly larger than the display area A/A to cover the entire display area A/A while partially covering the gate pads 210, the data pads 220, and the pattern 230.

Meanwhile, in the organic light emitting display according to the first embodiment, positions of the gate pads 210, the data pads 220, and the pattern 230 may be modified in various ways.

Figure 3:
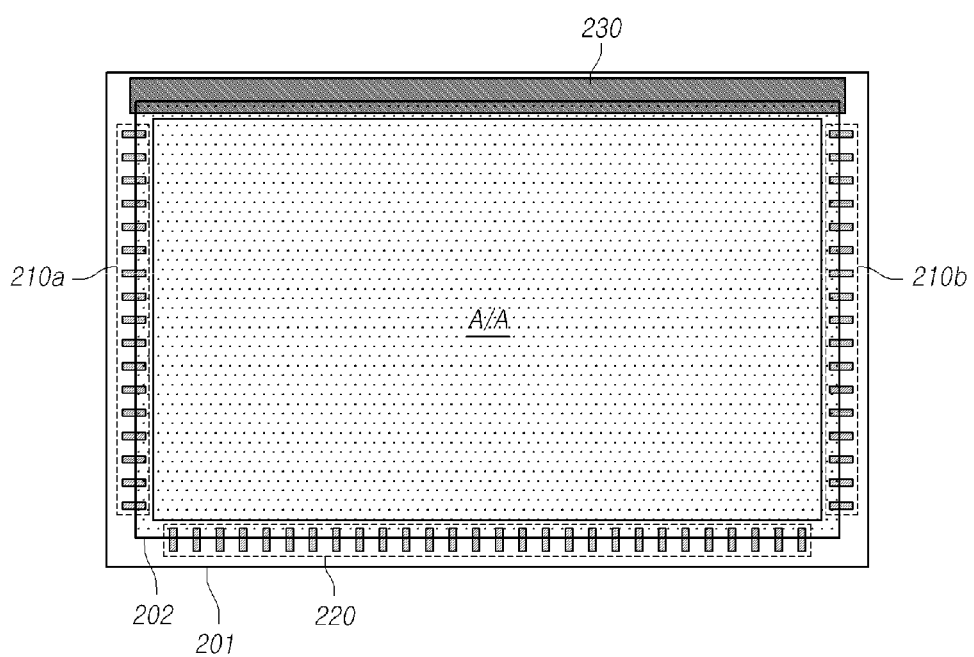
FIG. 3 is a plan view of an organic light emitting display according to an example embodiment modified from the first embodiment.

FIG. 3 is a plan view of an organic light emitting display according to an example embodiment modified from the first embodiment.

Referring to FIG. 3, the organic light emitting display according to the modified embodiment includes first gate pads 210a, which are formed at a part of a non-display area at the left side of the first substrate 201, and second gate pads 210b, which are formed at a part of a non-display area at the right side of the first substrate 201 and are opposite to the first gate pads 210a.

A plurality of data pads 220 are formed at a part of the non-display area located at an upper side or a lower side of the display area A/A of the first substrate 201.

Further, in the upper edge of the non-display area in which the first gate pads 210a, the second gate pads 210b, and the data pads 220 are not formed, a pattern 230 shaped like a character "-" is formed.

A second substrate 202 is disposed above and is spaced apart from the first substrate 201.

The second substrate 202 is formed to be slightly larger than the display area A/A to cover the entire display area A/A while partially covering the first gate pads 210a, the second gate pads 210b, the data pads 220, and the pattern 230.

In the organic light emitting display according to the embodiments described above, the display area A/A of the first substrate 201 is encapsulated by the second substrate 202 to thereby prevent oxygen or moisture from permeating into the organic light emitting devices in the display area A/A from the outside. Further, an opaque pattern 230 is formed in a non-display area of the first substrate 201 to prevent external light reflection in the display area A/A to thereby improve the visibility.

Meanwhile, in the case where the organic light emitting devices are encapsulated by the second substrate 202, when the first substrate 201 and the second substrate 202 are attached to each other by an adhesive layer, an adhesive failure may occur at an edge area of the second substrate 202. An adhesive failure generated in the second substrate 202 may allow bubbles or foreign materials from the outside to permeate into a gap between the first substrate 201 and the second substrate 202. In this event, if the first substrate 201 or the second substrate 202 is transparent, it is possible to detect a defect by visually finding bubbles or defects between the two substrates 201 and 202, which is called a screening process.

In the first embodiment described above, when the second substrate 202 is formed of a metal sheet, although it is possible to detect an adhesive failure through the second substrate 202, it is difficult to detect an adhesive failure due to the unevenness of the surface state of the metal substrate. Therefore, the transparent first substrate 201 is used to detect the adhesive failure between the first substrate 201 and the second substrate 202. However, since the pattern 230 is formed of an opaque material, it is not easy to detect an adhesive failure of the second substrate 202 at the part covered by the pattern 230.

Therefore, in order to enable detection of an adhesive failure of the second substrate 202 in the non-display area having the pattern 230 formed therein, a part of the pattern 230 may be opened.

Figure 4:
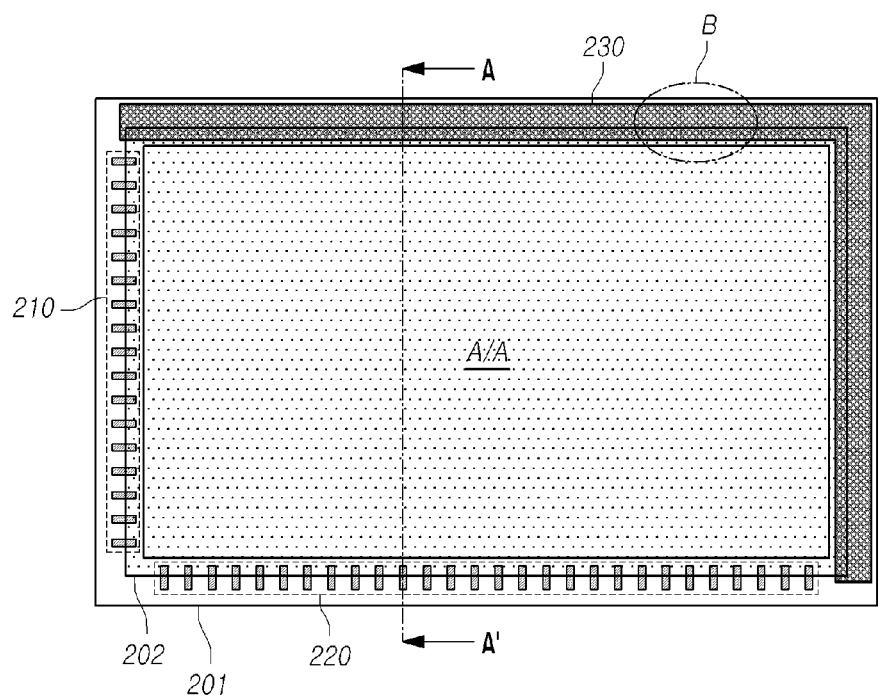
FIG. 4 is a plan view of an organic light emitting display according to a second example embodiment of the present invention.
Figure 5:
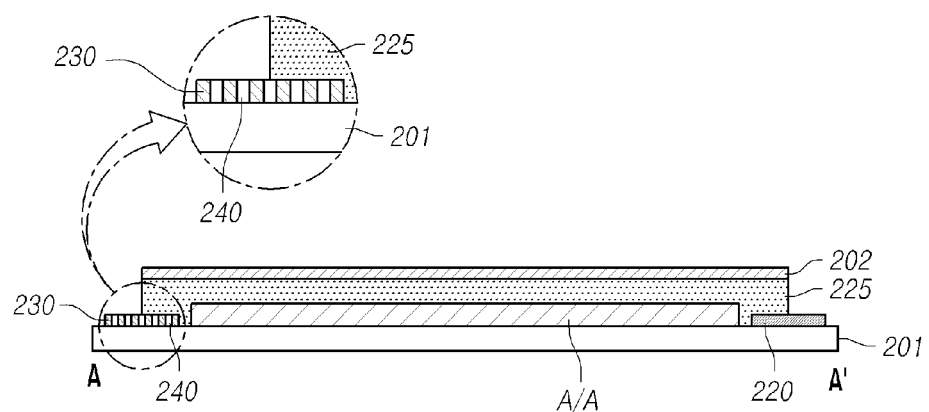
FIG. 5 is a sectional view of an organic light emitting display according to the second example embodiment of the present invention, taken along line A-A' in FIG. 4.

FIG. 4 is a plan view of an organic light emitting display according to a second example embodiment of the present invention. FIG. 5 is a sectional view of an organic light emitting display according to the second example embodiment of the present invention, taken along line A-A' in FIG. 4.

Referring to FIGS. 4 and 5, organic light emitting devices are formed in a display area A/A of a first substrate 201. Further, a plurality of gate pads 210 are formed at one edge of a non-display area of the first substrate 201 and a plurality of data pads 220 are formed at another edge of the non-display area. For example, the gate pads 210 are formed in the non-display area at the left side of the display area A/A and the data pads 220 are formed in the non-display area at the lower side of the display area A/A. Of course, the gate pads 210 may be formed in the non-display area at the right side of the display area A/A instead of the left side thereof, and the data pads 220 may be formed in the non-display area at the upper side of the display area A/A instead of the lower side thereof.

Further, in the edges of the non-display area of the first substrate 201 in which the gate pads 210 and the data pads 220 are not formed, a pattern 230 having a shape of a character "┐" and having openings 240 formed therein is formed.

The pattern 230 is formed of an opaque material. The pattern 230 may be formed of metal, for example, a gate metal material or a source/drain metal material. Further, when the pattern 230 is formed of metal, the pattern 230 can be used as a part of a power supply line, such as a low power supply line or a high power supply line, to supply electric power to the organic light emitting devices.

The openings 240 of the pattern 230 are arranged to detect an adhesive failure between the first substrate 201 and the second substrate 202, so that each of the openings 240 is required to have a desired size. That is, each of the openings 240 is required to be larger than or equal to a minimum size of foreign materials including bubbles to enable detection of the foreign materials and have a diameter smaller than or equal to a minimum size capable of degrading the visibility in order to prevent external light reflection. For example, each of the openings 240 may have a diameter of 3 to 10 μm.

The pattern 230 may have various types of openings 240. For example, each of the openings 240 may have, without being limited thereto, a shape of a horizontal line, a vertical line, a diagonal line, a cross line, a circle, or a polygon.

FIGS. 6A to 6D are enlarged views of the encircled part B of FIG. 4 showing various types of openings of the pattern.

Figure 6A:
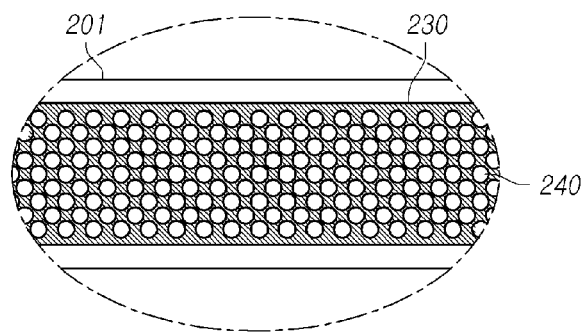
FIGS. 6A to 6D are enlarged views of the encircled part B of FIG. 4 showing various types of openings of the pattern.
Figure 6B:
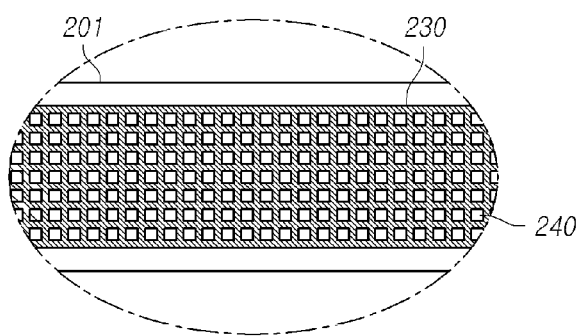
Figure 6C:
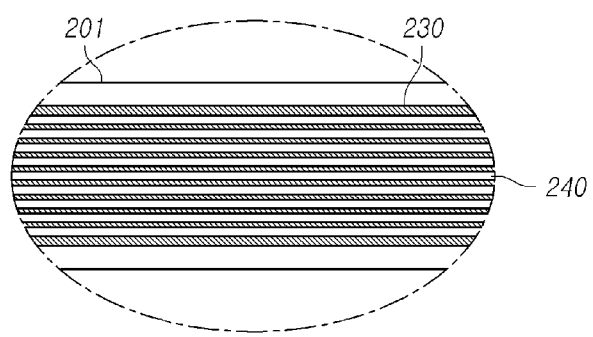
Figure 6D:
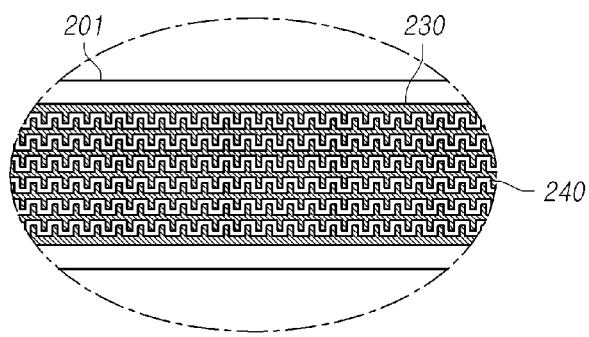

Referring to FIGS. 6A to 6D, each of the openings 240 formed through the first substrate 201 may have a circular shape (FIG. 6A), a rectangular shape (FIG. 6B), a striped shape (FIG. 6C), or a pulse shape (FIG. 6D). However, the present invention is not limited to the illustrated shape and may be applied to any other shape capable of partly opening the pattern. The openings 240 are arranged to enable an adhesive failure to be detected through the openings 240 when the first substrate 201 has been encapsulated by the second substrate 202, and can thus be modified without a limit to the shape and size of the openings 240 as long as foreign materials can be detected and external light reflection can be prevented.

Therefore, when the first substrate 201 is encapsulated by the second substrate 202 formed of a metal sheet, an adhesive failure of the second substrate 202 can be detected through the lower part of the first substrate 201. Further, even in the part on which the pattern 230 is formed, an adhesive failure of the second substrate 202 can be detected through the openings 240 of the pattern 230.

Referring to FIGS. 4 and 5 again, the second substrate 202 is disposed above and is spaced apart from the first substrate 201.

In order to protect the organic light emitting devices, the second substrate 202 is formed to be slightly larger than the display area A/A to cover the entire display area A/A while partially covering the pattern 230 having the openings 240.

An adhesive layer 225 is formed between the first substrate 201 and the second substrate 202. The first substrate 201 and the second substrate 202 are attached to each other by the adhesive layer 225. The adhesive layer 225 may be formed of an optical hardening, thermal hardening, or natural hardening material, and may include, for example, a resin-based material. In order to protect the organic light emitting devices, like the second substrate 202, the adhesive layer 225 is formed to be slightly larger than the display area A/A to cover the entire display area A/A while partially covering the pattern 230 having the openings 240 formed therein.

Although FIGS. 4 and 5 show the openings 240 formed over the entire pattern 230, the present invention is not limited thereto and the openings 240 may be formed through only a part of the pattern 230 covered by the adhesive layer 225.

Therefore, after encapsulating the first substrate 201 by the second substrate 202, in a screening process for detecting an adhesive failure of the attached second substrate 202, it is possible to find foreign materials, such as bubbles, generated by the adhesive failure of the second substrate 202 through the openings 240 of the pattern 230 or the first substrate 201.

Meanwhile, the position at which the pattern 230 is formed in the non-display area of the first substrate 201 may be determined in various ways as described below.

Figure 7:
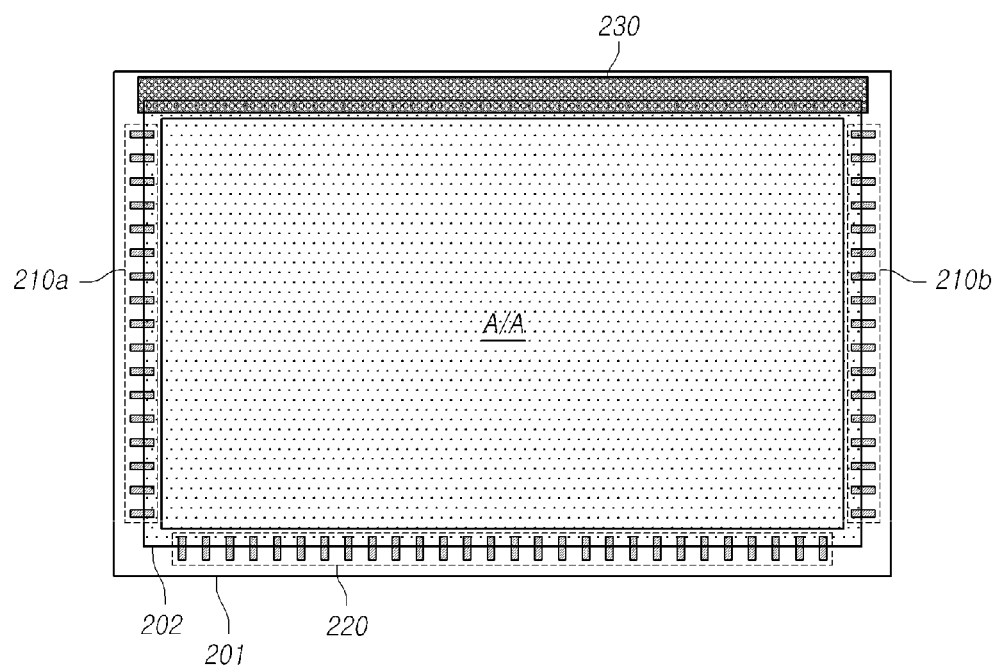
FIG. 7 is a plan view of an organic light emitting display according to an example embodiment modified from the second embodiment.

FIG. 7 is a plan view of an organic light emitting display according to an example embodiment modified from the second embodiment.

Referring to FIG. 7, the first substrate 201 includes a display area (A/A) in which organic light emitting devices are formed. Further, as in the second embodiment, a plurality of first gate pads 210a are formed at the left edge of a non-display area of the first substrate 201 and a plurality of data pads 220 are formed at the lower edge of the non-display area. Further, a plurality of second gate pads 210b are formed at the right edge of the non-display area.

In the other part of the non-display area in which the first and second gate pads 210a and 210b and the data pads 220 are not formed, a pattern 230 having a shape of a character "–" is formed.

The pattern 230 is formed to have openings 240 as shown in FIGS. 6A to 6D to detect an adhesive failure of the second substrate 202.

As in the first embodiment, a second substrate 202 is disposed above and spaced apart from the first substrate 201 to encapsulate the first substrate 201.

Therefore, when the first substrate 201 is encapsulated by the second substrate 202 formed of a metal sheet, an adhesive failure of the second substrate 202 can be detected through the lower part of the first substrate 201. Further, even in the parts on which the patterns 230 are formed, an adhesive failure of the second substrate 202 can be detected through the openings of the patterns 230.

Figure 8:
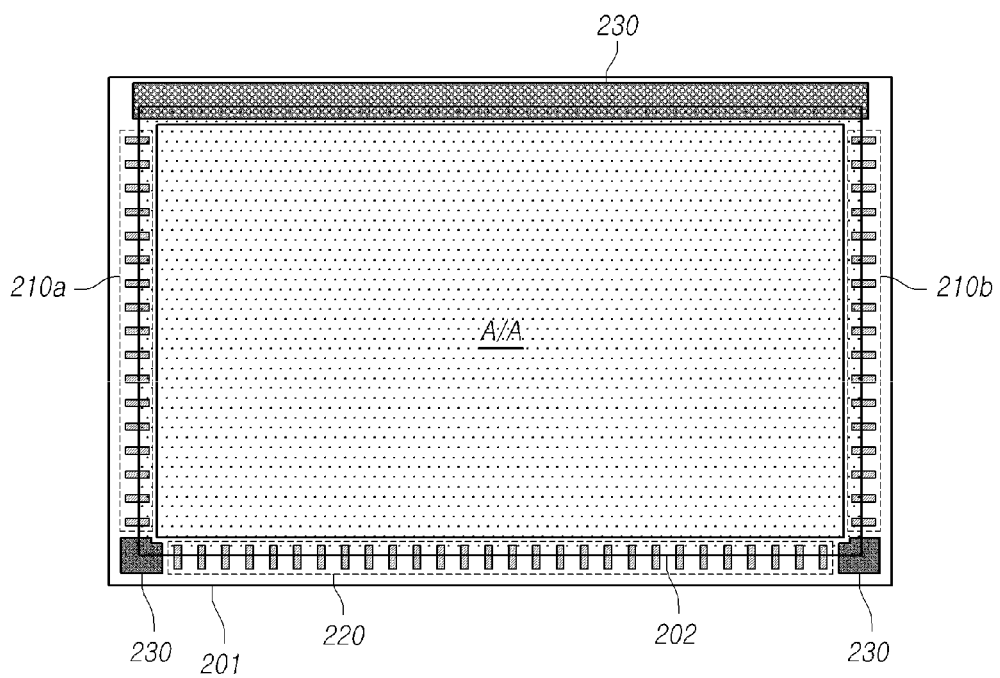
FIG. 8 is a plan view of an organic light emitting display according to another example embodiment modified from the second embodiment.

FIG. 8 is a plan view of an organic light emitting display according to another example embodiment modified from the second embodiment.

Referring to FIG. 8, first gate pads 210a and second gate pads 210b are formed at opposite edges of a non-display area of the first substrate 201 and data pads 220 are formed at another edge of the non-display area of the first substrate 201. Further, a pattern 230 shaped like a character "–" is formed at the edge of the non-display area opposite to the edge at which the data pads 220 are formed.

Further, a second substrate 202 is disposed above and is spaced apart from the first substrate 201.

In this event, patterns 230 may be additionally formed at corners between the edges of the non-display area at which the gate pads 210a and 210b and the data pads 220 are formed.

The patterns 230 formed at the edge and corners of the non-display area of the first substrate 201, at which the gate pads 210a and 210b and the data pads 220 are not formed, have openings (see 240 of FIGS. 6A to 6D) as shown in FIGS. 6A to 6D.

Therefore, when the first substrate 201 is encapsulated by the second substrate 202 formed of a metal sheet, an adhesive failure of the second substrate 202 can be detected through the lower part of the first substrate 201. Further, even in the parts on which the patterns 230 are formed, an adhesive failure of the second substrate 202 can be detected through the openings of the patterns 230.

Therefore, the patterns 230 are formed also at the area between the first gate pads 210a and the data pads 220 and at the area between the second gate pads 210b and the data pads 220, so as to prevent external light reflection and enable inspection of an adhesive failure.

Figure 9:
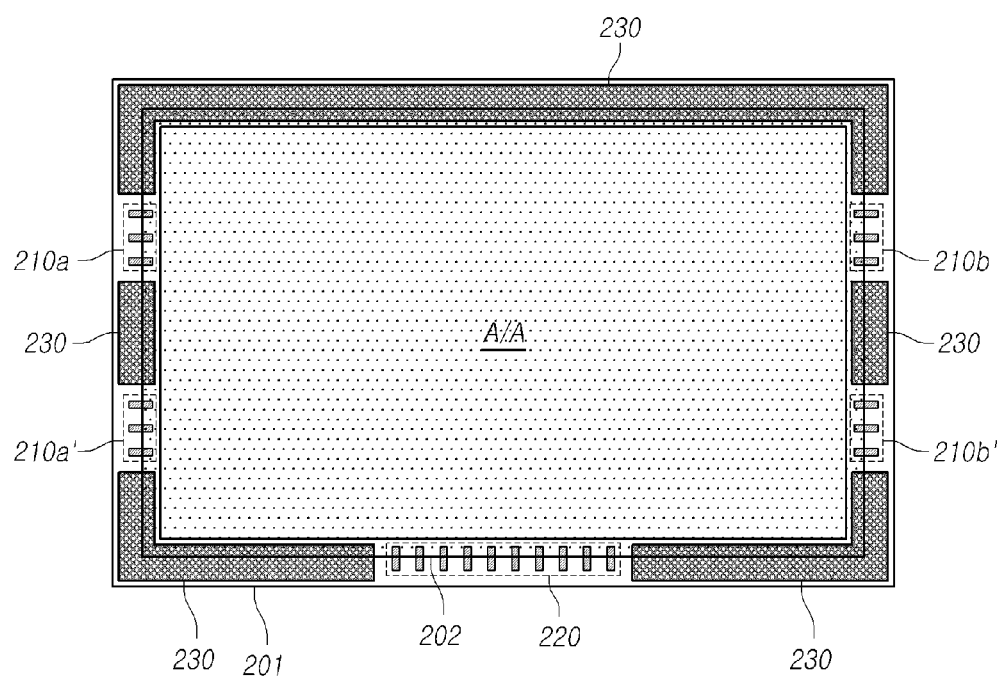
FIG. 9 is a plan view of an organic light emitting display according to another example embodiment modified from the second embodiment of the present invention.

FIG. 9 is a plan view of an organic light emitting display according to another example embodiment modified from the second embodiment of the present invention.

Referring to FIG. 9, first gate pads 210a, second gate pads 210b, data pads 220, and patterns 230 are formed at a non-display area of the first substrate 201.

Multiple groups of first gate pads 210a and 210a' spaced apart from each other are formed at one edge of a non-display area, multiple groups of second gate pads 210b and 210b' spaced apart from each other are formed at an opposite edge of the non-display area opposite to the first gate pads 210a and 210a', and data pads 220 are formed at another edge of the non-display area.

Specifically, in the non-display area, the group of first gate pads 210a and the group of first gate pads 210a' are spaced apart from each other and the group of second gate pads 210b and the group of second gate pads 210b' are spaced apart from each other. Meanwhile, the data pads 220 are formed at a part of the lower edge of the non-display area.

The patterns 230 have openings as shown in FIGS. 6A to 6D and are formed at portions of the non-display area of the first substrate 201, at which the first gate pads 210a and 210a', the second gate pads 210b and 210b', and the data pads 220 are not formed. For example, the patterns 230 having openings are formed between the first gate pads 210a and the other first gate pads 210a' and the patterns 230 having openings are also formed between the second gate pads 210b and the other second gate pads 210b'.

Therefore, an organic light emitting display according to the embodiments described above can minimize light reflection by the pattern formed at a non-display area thereof, to thereby enhance the visibility of the display. Further, in the display, openings formed through the pattern allow easy detection of an adhesive failure which may be caused at the time of attachment of the second substrate formed of a metal sheet.

Although various embodiments are described above with reference to the accompanying drawings, the present invention is not limited to them.

In the embodiments described above, the gate pads and the data pads are formed at different edges. However, the present invention is not limited to such a configuration and allows the gate pads and the data pads to be formed at one edge of a non-display area.

It will be apparent to those skilled in the art that various modifications and variations can be made in the organic light emitting display of the present invention without departing from the spirit or scope of the invention. Thus, it is intended that the present invention cover the modifications and variations of this invention provided they come within the scope of the appended claims and their equivalents.

What is claimed is:

1. An organic light emitting display, comprising:
    a first substrate including a display area where an organic light emitting device is formed and a non-display area with a pad edge area and a non-pad edge area;
    a second substrate facing and spaced apart from the first substrate;
    one or more pads formed in the pad edge area, wherein the pads comprise at least two gate pads formed at one or more edges of the non-display area of the first substrate and at least two data pads formed at one or more edges of the non-display area of the first substrate;
    a pattern formed in the non-pad edge area of the first substrate and having openings disclosing the second substrate; and
    an adhesive layer formed between the first substrate and the second substrate, the adhesive layer covering a portion of the pattern.

2. The organic light emitting display of claim 1, wherein the openings are formed at the portion of the pattern covered by the adhesive layer.

3. The organic light emitting display of claim 1, wherein the second substrate is a metal sheet.

4. The organic light emitting display of claim 1, wherein the pattern is formed of an opaque material.

5. The organic light emitting display of claim 4, wherein the pattern is formed of a gate metal material or a source/drain metal material.

6. The organic light emitting display of claim 1, wherein the pattern is formed between the gate pads or between the data pads.

7. The organic light emitting display of claim 1, wherein the pattern is used as a portion of a power supplying line providing electric power to the organic light emitting device.

8. The organic light emitting display of claim 1, wherein the display area including pixels formed therein is encapsulated by the second substrate.

9. The organic light emitting display of claim 8, wherein the second substrate corresponds to an encapsulation substrate formed of a plastic thin film or a metal sheet.

10. The organic light emitting display of claim 1, wherein the second substrate is formed to be larger than the display area.

11. The organic light emitting display of claim 10, wherein the second substrate partially covers the gate pads, the data pads, and the pattern.

12. The organic light emitting display of claim 1, wherein the adhesive layer is formed between the first substrate and the second substrate.

13. The organic light emitting display of claim 12, wherein the adhesive layer is formed of at least one of an optical hardening material, thermal hardening material, or natural hardening material.

14. The organic light emitting display of claim 1, wherein the openings have a diameter of 3 to 10 μm.

15. The organic light emitting display of claim 1, wherein the openings have one shape of a horizontal line, a vertical line, a diagonal line, a cross line, a circle, or a polygon.

16. The organic light emitting display of claim 1, wherein the openings formed through the first substrate have one shape of a circular, a rectangular, a striped, or a pulse.

* * * * *